(12) United States Patent
Itabashi et al.

(10) Patent No.: US 9,419,574 B2
(45) Date of Patent: Aug. 16, 2016

(54) AMPLIFIER CIRCUIT

(71) Applicant: SUMITOMO ELECTRIC INDUSTRIES, LTD., Osaka-shi, Osaka (JP)

(72) Inventors: Naoki Itabashi, Yokohama (JP); Keiji Tanaka, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 15 days.

(21) Appl. No.: 14/508,260

(22) Filed: Oct. 7, 2014

(65) Prior Publication Data

US 2015/0097622 A1    Apr. 9, 2015

(30) Foreign Application Priority Data

Oct. 8, 2013   (JP) .................................. 2013-211307

(51) Int. Cl.
*H03G 3/30* (2006.01)
*H04B 10/50* (2013.01)

(52) U.S. Cl.
CPC .............. *H03G 3/30* (2013.01); *H03G 3/3084* (2013.01); *H04B 10/50593* (2013.01)

(58) Field of Classification Search
CPC ..................................... H03F 3/08; H03F 3/68
USPC ............................... 330/124 R, 280, 295, 308
See application file for complete search history.

(56) References Cited

U.S. PATENT DOCUMENTS

2010/0259325 A1* 10/2010 Saunders ................. H01Q 3/26
330/124 R

FOREIGN PATENT DOCUMENTS

JP         2012-215662       11/2012

* cited by examiner

*Primary Examiner* — Steven J Mottola
(74) *Attorney, Agent, or Firm* — Smith, Gambrell & Russell, LLP.

(57) ABSTRACT

An amplifier circuit has: a main amplifier connected between an input terminal and an output terminal, the main amplifier amplifying an input signal input to the input terminal and outputting an amplified signal to the output terminal; a compensation circuit comprising a variable delay circuit and a variable gain inverting circuit, the variable delay circuit receiving the input signal and outputting a delay signal with a delay time from the input signal, the variable gain inverting circuit inverting and amplifying the delay signal with a gain and outputting a compensation signal to the output terminal; and a controller configured to control the gain of the variable gain inverting circuit and the delay time of the variable delay circuit to compensate a response of the main amplifier in a first frequency of a target signal of compensation and in a low frequency band higher than zero Hertz.

6 Claims, 12 Drawing Sheets

AMPLIFIER CIRCUIT

BACKGROUND OF THE INVENTION

1. Field of the Invention

The present invention relates to an amplifier circuit and, more particularly, to an amplifier circuit used in an optical transmitter.

2. Related Background Art

In the field of optical communication, optical transmitters are used as devices for converting an input electric signal to an optical signal and sending the optical signal as an output signal to a transmission line (e.g., cf. Japanese Patent Application Laid-Open Publication No. 2012-215662). The optical transmitter described in the Publication No 2012-215662 is provided with a laser diode which outputs continuous wave (CW) light, a modulator which modulates the intensity of the CW light output from the laser diode and outputs the modulated light as an optical signal, and a modulator driving circuit for generating a driving signal to drive the modulator based on an input electric signal.

The optical transmitter described in the Publication No. 2012-215662 is further provided with an amplitude detection circuit for detecting the amplitude of the input signal and with a controller for generating a waveform control signal based on the amplitude of the input signal detected by the amplitude detection circuit. The modulator driving circuit controls the waveform of the driving signal, based on the waveform control signal generated by the controller. As constructed in this configuration, the optical transmitter described in the Publication No. 2012-215662 compensates variation in the amplitude of the input signal with the waveform control signal in order to keep the waveform of the optical output from the optical transmitter.

SUMMARY OF THE INVENTION

In the optical transmitter, it is preferable to suitably keep the output signal, irrespective of the amplitude or bit pattern of the input signal. In the optical transmitter described in the Publication No. 2012-215662, however, a loss in a path from the input signal source to the amplitude detection circuit has frequency characteristics. In general, the frequency characteristics shows that the loss on the high frequency band is larger than the loss on the low frequency band. For this reason, when a bit pattern in which the same bits continue, for example, such as (000000), is input as the input signal, the base frequency of the input signal is low and this makes the loss of the input signal small. In contrast to it, when a bit pattern in which different bits are alternately repeated, for example, such as (010101), is input as the input signal, the base frequency of the input signal is high and this makes the loss of the input signal large. Since the loss of the input signal changes depending upon the bit pattern of the input signal as described above, the amplitude of the input signal detected by the amplitude detection circuit also changes. Accordingly, the optical transmitter may fail to suitably keep the waveform of the output signal against the variation in the amplitude or the bit pattern or the like of the input signal, so as to cause degradation of the waveform of the output signal.

An amplifier circuit according to one aspect of the present invention is an amplifier circuit with an input terminal and an output terminal, which comprises: a main amplifier connected between the input terminal and the output terminal, the main amplifier amplifying an input signal input to the input terminal and outputting an amplified signal to the output terminal; a compensation circuit connected in parallel to the main amplifier, the compensation circuit comprising a variable delay circuit and a variable gain inverting circuit, the variable delay circuit receiving the input signal and outputting a delay signal with a delay time from the input signal, the variable gain inverting amplifier inverting and amplifying the delay signal with a gain and outputting a compensation signal to the output terminal; and a controller configured to control the gain of the variable gain inverting amplifier and the delay time of the variable delay circuit so as to compensate a response of the main amplifier in a first frequency band lower than a base frequency of a target signal of compensation and in a low frequency band higher than zero Hertz.

DETAILED DESCRIPTION OF THE PREFERRED EMBODIMENTS

Figure 1:
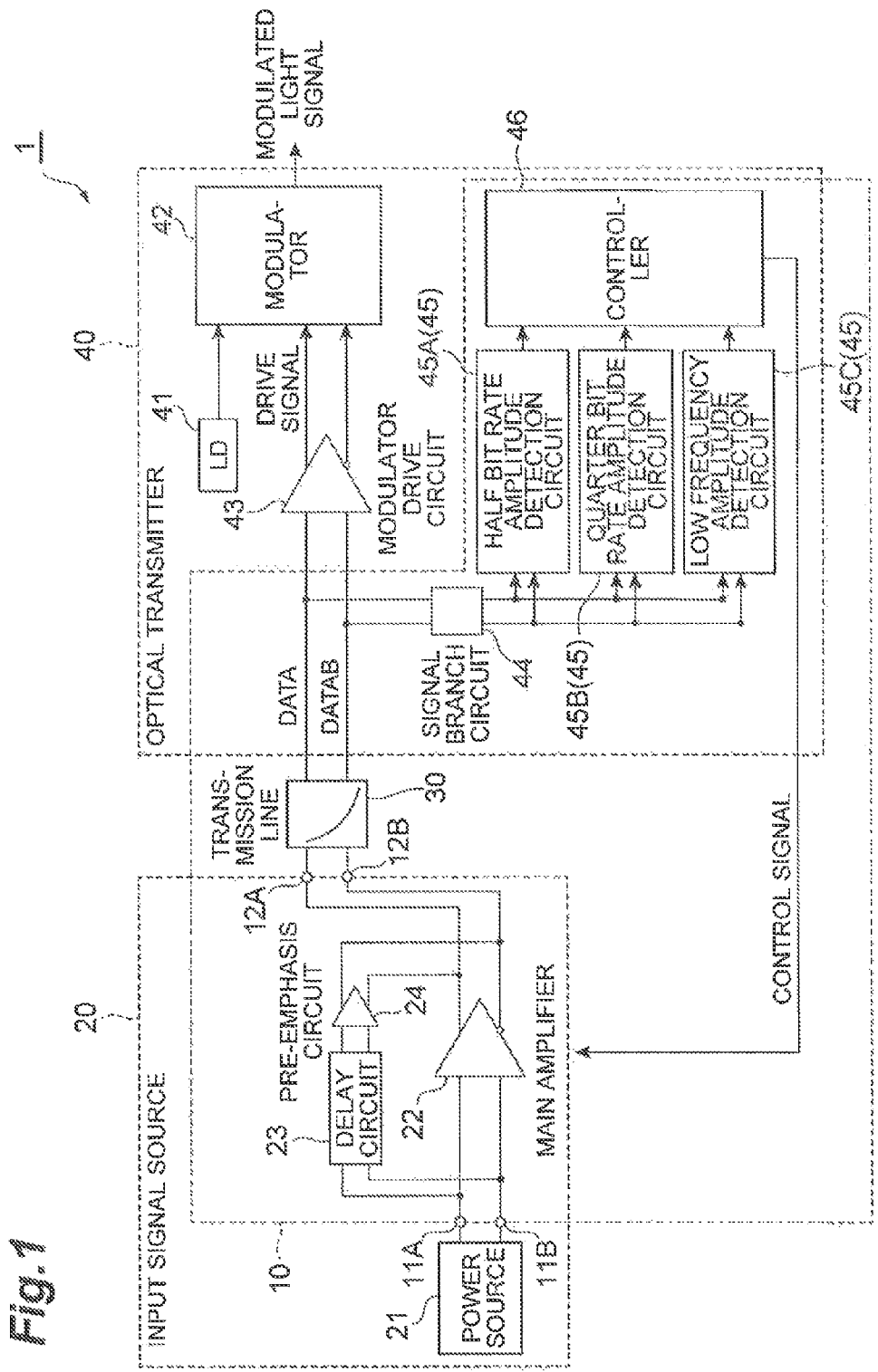
FIG. 1 is a block diagram showing a configuration of an amplifier circuit according to an embodiment of the present invention.

An amplifier circuit according to one aspect of the present invention is an amplifier circuit with an input terminal and an output terminal, which comprises: a main amplifier connected between the input terminal and the output terminal, the main amplifier amplifying an input signal input to the input terminal and outputting an amplified signal to the output terminal; a compensation circuit connected in parallel to the main amplifier, the compensation circuit comprising a variable delay circuit and a variable gain inverting circuit, the variable delay circuit receiving the input signal and outputting a delay signal with a delay time from the input signal, the variable gain inverting amplifier inverting and amplifying the delay signal with a gain and outputting a compensation signal to the output terminal; and a controller configured to control the gain of the variable gain inverting amplifier and the delay time of the variable delay circuit so as to compensate a response of the main amplifier in a first frequency band lower than a base frequency of a target signal of compensation and in a low frequency band higher than zero Hertz.

The amplifier circuit as described above is configured to add the input signal amplified by the variable gain inverting amplifier after delayed by the variable delay circuit, to the input signal amplified by the main amplifier. This operation results in emphasizing rises and falls of the input signal of a nearly rectangular wave shape. Here, the controller in this amplifier circuit controls the gain of the variable gain inverting amplifier and the delay time of the variable delay circuit so as to compensate the response of the main amplifier in the first frequency band lower than the base frequency of the target signal and in the low frequency band higher than zero Hertz. Therefore, the response of the input signal is compensated in the first frequency band and in the low frequency band, so as to suitably compensate rises and falls of the input signal and, as a result, the waveform of the input signal is suitably compensated. Accordingly, the waveform of the output signal can be suitably compensated according to variation of the input signal.

In the above amplifier circuit, the first frequency band may include a frequency equal to a half of the base frequency of the target signal.

In this case, since the response of the input signal is compensated in the band including the frequency equal to a half of the base frequency of the target signal and in the low frequency band, the waveform of the input signal is more suitably compensated and, as a result, the waveform of the output signal can be more suitably compensated according to variation of the input signal.

The controller may control the gain of the variable gain inverting amplifier and the delay time of the variable delay circuit so as to farther compensate the response of the main amplifier in a second frequency band including a frequency equal to a quarter of the base frequency of the target signal.

In this case, since the response of the input signal is further compensated in the band including the frequency equal to a quarter of the baser frequency of the target signal, the waveform of the input signal is further suitably compensated and, as a result, the waveform of the output signal can be further suitably compensated according to variation of the input signal.

The controller may change the gain of the variable gain inverting amplifier, thereby to compensate the response of the main amplifier in the low frequency band and change the delay time of the variable delay circuit, thereby to compensate the response of the main amplifier in the first frequency band and in the second frequency band.

The foregoing amplifier circuit can compensate the waveform of the input signal so that the response of the main amplifier is largely varied in the low frequency band, with change in the gain of the variable gain inverting amplifier. Furthermore, it can compensate the waveform of the input signal so that the response of the main amplifier is largely varied, particularly, from the first frequency band to the second frequency band, with change in the delay time of the variable delay circuit. Therefore, the above configuration allows such control as to control change amounts of the gain of the variable gain inverting amplifier and the delay time of the variable delay circuit necessary for suitably compensating the waveform of the input signal.

The amplifier circuit may further comprise: a signal transmission element connected to the output terminal; a low frequency detection circuit connected to the signal transmission element, the low frequency detection circuit detecting the amplitude in the low frequency band of a signal transmitted through the signal transmission element; and a first frequency detection circuit connected to the signal transmission element, the first frequency detection circuit detecting the amplitude in the first frequency band of the signal transmitted through the signal transmission element; and the controller may control the gain of the variable gain inverting amplifier and the delay time of the variable delay circuit, based on the amplitudes detected by the low frequency detection circuit and by the first frequency detection circuit.

In this case, the amplitudes of the signal transmitted through the signal transmission element are detected by the low frequency detection circuit and by the first frequency detection circuit and the controller controls the gain of the variable gain inverting amplifier and the delay time of the variable delay circuit, based on the amplitudes of this detected signal. For this reason, the compensation for the waveform of the input signal is made by taking the frequency characteristics of the signal transmission element into account. Therefore, the waveform of the input signal can be more suitably compensated.

The amplifier circuit may further comprise: a final-stage amplifier connected to the signal transmission element, the final-stage amplifier amplifying the signal transmitted through the signal transmission element; and the low frequency detection circuit and the first frequency detection circuit may detect the amplitude of the signal amplified by the final-stage amplifier.

In this case, the amplitudes of the signal amplified by the final-stage amplifier are detected by the low frequency detection circuit and by the first frequency detection circuit and the controller controls the gain of the variable gain inverting amplifier and the delay time of the variable delay circuit, based on the amplitudes of this detected signal. For this reason, the compensation for the waveform of the input signal is made by taking the frequency characteristics of the final-stage amplifier into account. Therefore, the waveform of the input signal can be more suitably compensated.

An embodiment of an amplifier circuit according to one aspect of the present invention will be described below in detail with reference to the accompanying drawings. In the description of the drawings the same elements will be denoted by the same reference signs, without redundant description.

As shown in FIG. 1, the optical transmission device 1 according to the present embodiment is provided, for example, with an input signal source 20, a transmission line 30 (signal transmission element) connected to the output side of the input signal source 20, and an optical transmitter 40 connected to the side opposite to the input signal source 20 in the transmission line 30.

The input signal source 20 has a power source 21 which generates an electric input signal. The optical transmitter 40 has a laser diode (LD) 41, a modulator 42, and a modulator driving circuit 43. The modulator 42 modulates light emitted from the laser diode 41, based on a drive signal according to the input signal generated by the power source 21. The modulator driving circuit 43 amplifies the input signal DATA, DATAB in differential form transmitted through the transmission line 30 from the input signal source 20, to generate the drive signal for driving the modulator 42. The amplifier circuit 10 according to the present embodiment is used for amplify the input signal from. the power source 21 and outputting an amplified signal to the modulator driving circuit 43.

The amplifier circuit 10 has a pair of input terminals 11A, 11B and a pair of output terminals 12A, 12B. The input terminals 11A, 11B are connected to outputs of the power source 21 and the input signal from the power source 21 is input as a differential signal. The output terminals 12A, 12B are connected to one end side of the transmission line 30 and output the drive signal in differential form onto the transmission line 30.

The amplifier circuit 10 is provided with a main amplifier 22 (main amplification device), a variable delay circuit 23 connected in parallel to the main amplifier 22, and a pre-emphasis circuit 24 (variable gain inverting amplifier) connected as a subsequent stage to the variable delay circuit 23. In the present embodiment, the main amplifier 22, variable delay circuit 23, and pre-emphasis circuit 24 are disposed inside the input signal source 20.

The main amplifier 22 is a frilly differential amplification circuit which amplifies the input signal in differential form supplied to the input terminals 11A, 11B. Outputs of the main amplifier 22 are connected to the output terminals 12A, 12B. Therefore, the main amplifier 22 is connected between the input terminals 11A, 11B and the output terminals 12A, 12B.

The variable delay circuit 23 is connected in parallel to the main amplifier 22. In other words, input terminals of the variable delay circuit 23 are connected to the input terminals of the main amplifier 22. The variable delay circuit 23 delays the input signal supplied to the input to/unities 11A, 11B by a predetermined delay time. This predetermined delay time is variable according to a control signal output from below-described controller 46. The variable delay circuit 23 is configured, for example, using a transmission line and a variable capacitance element having the MOS (Metal-Oxide-Semiconductor) structure. The length and width of the transmission line are properly set so that the transmission line has an inductive impedance in the frequency band of the input signal. The capacitance of the variable capacitance element can be varied, for example, by changing a bias voltage applied to the variable capacitance element.

The pre-emphasis circuit 24 inverts and amplifies a signal output from the variable delay circuit 23, at a predetermined gain. This predetermined gain is variable according to a control signal output from the below-described controller 46. Output terminals of the pre-emphasis circuit 24 are connected to the output terminals of the main amplifier 22. Namely, the output terminals of the pre-emphasis circuit 24 are connected to the output terminals 12A, 12B. By this, the signal output from the pre-emphasis circuit 24 is added to the signal output from the main amplifier 22.

Input terminals of the modulator driving circuit 43 are connected through the transmission line 30 to the output terminals 12A, 12B. The transmission line 30 is, for example, a connector or a cable. The modulator driving circuit 43 is a differential amplifier circuit which amplifies a signal fed through the transmission line.

A signal branch circuit 44 is connected as branching off from lines connecting the transmission line 30 and the input terminals of the modulator driving circuit 43. The signal branch circuit 44 is preferably configured by connecting three resistive elements in the T-shape, for example, when the frequency of the input signal is not more than about 20 GHz. When the frequency of the input signal is not less than 20 GHz, it is preferably configured by transmission lines connected in the T-shape. The signal branch circuit 44 is properly designed so as not to affect high-frequency matching, so as to suppress reduction of the amplitude of the signal input to the modulator driving circuit 43 as much as possible, so as to attenuate reflection from subsequent-stage amplitude detection circuit 45 if it exists, and so as to transmit information indicative of the input amplitude to the amplitude detection circuit 45.

Connected in parallel as subsequent stages to the signal branch circuit 44 are a half bit rate amplitude detection circuit 45A (first frequency detection circuit), a quarter bit rate amplitude detection circuit 45B (second frequency detection circuit), and a low frequency amplitude detection circuit 45C (low frequency detection circuit). In the description hereinafter, the half bit rate amplitude detection circuit 45A, the quarter bit rate amplitude detection circuit 45B, and the low frequency amplitude detection circuit 45C will be sometimes referred to collectively as amplitude detection circuit 45 as a general term. The half bit rate amplitude detection circuit 45A detects the amplitude of a component in a first frequency band including a frequency equal to a half of a frequency corresponding to a bit rate (e.g., 50 GHz) of the input signal as a target signal, which is included in the signal transmitted through the transmission line 30. The quarter bit rate amplitude detection circuit 45B detects the amplitude of a component in a second frequency band including a frequency equal to a quarter of the frequency corresponding to the bit rate of the input signal, Which is included in the signal transmitted through the transmission line 30. The lower frequency amplitude detection circuit 45C detects a component in a low frequency band including a frequency (e.g., 1 GHz) sufficiently lower than the bit rate of the input signal, which is included in the signal transmitted through the transmission line 30.

Outputs of the half bit rate amplitude detection circuit 45A, the quarter bit rate amplitude detection circuit 45B, and the low frequency amplitude detection circuit 45C are connected to the controller 46. The controller 46 outputs a control signal according to information of the amplitudes output from the half bit rate amplitude detection circuit 45A, the quarter bit rate amplitude detection circuit 45B, and the low frequency amplitude detection circuit 45C, to the variable delay circuit 23 and the pre-emphasis circuit 24. By such operation, the controller 46 controls the delay time of the variable delay circuit 23 and the gain of the pre-emphasis circuit 24 so as to compensate the response of the main amplifier 22 in the aforementioned first frequency band, second frequency band, and low frequency band.

Figure 2:
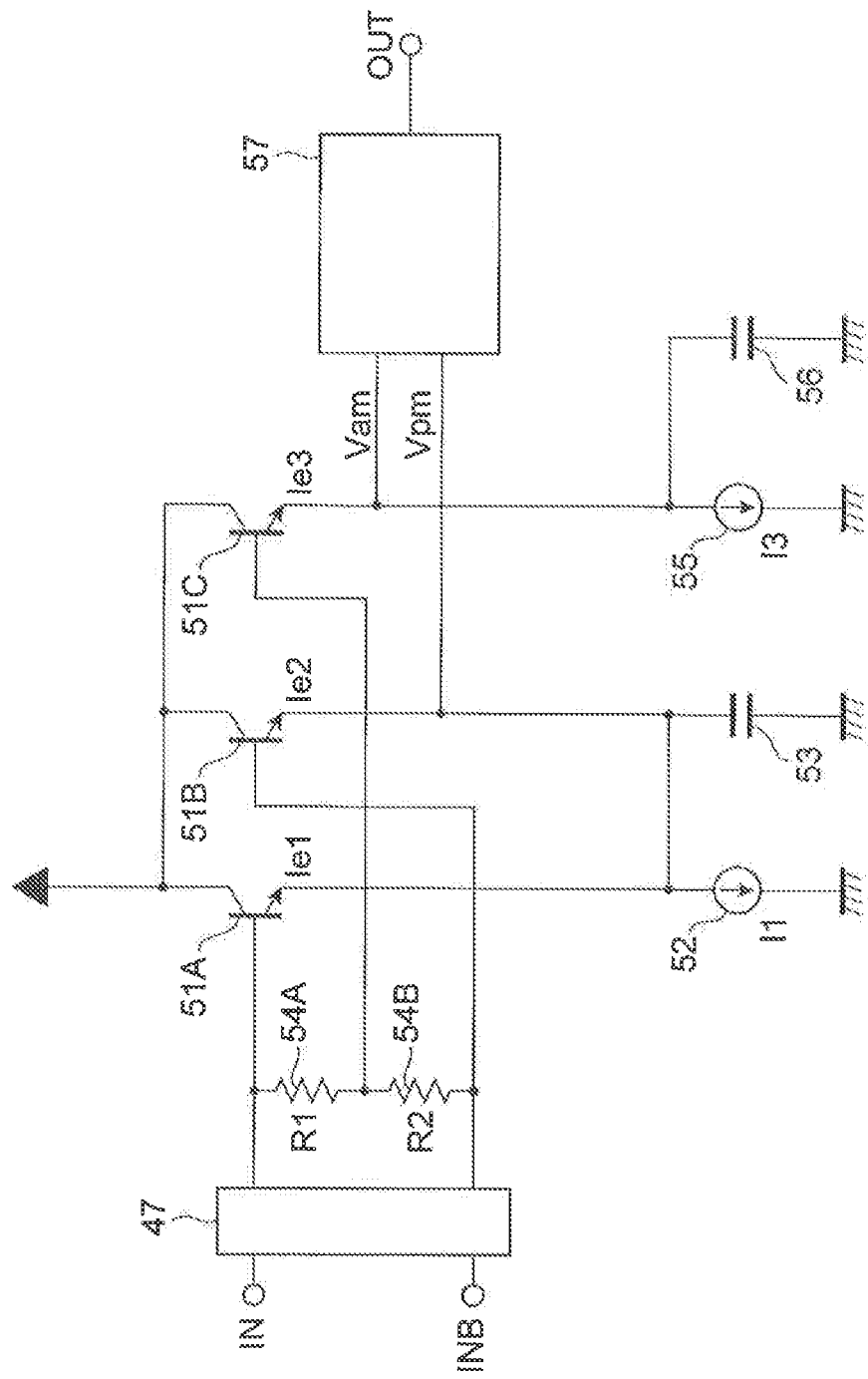
FIG. 2 is a circuit diagram showing an example of an amplitude detection circuit.

A circuit configuration of the amplitude detection circuit 45 will be described with reference to FIG. 2. The amplitude detection circuit 45 has a pair of input terminals IN, INB and one output terminal OUT.

The pair of input terminals IN, INB re connected to a filter 47. This filter 47 is a filter that allows a signal in a frequency band as a target of detection by the amplitude detection circuit 45 to be transmitted and that blocks any signal in the other frequency bands. For example, the filter 47 provided in the half bit rate amplitude detection circuit 45A allows the signal in the aforementioned first frequency band to be transmitted but blocks signals in the other frequency bands. The filter 47 provided in the quarter bit rate amplitude detection circuit 45B allows the signal in the aforementioned second frequency band to be transmitted but blocks signals in the other frequency bands. The filter 47 provided in the low frequency amplitude detection circuit 45C allows the signal in the aforementioned low frequency band to be transmitted but blocks signals in the other frequency bands.

The amplitude detection circuit 45 has a pair of transistors 51A, 51B. Base terminals of the transistors 51A, 51B are connected through the filter 47 to the input terminals IN, INB, respectively. Collector terminals of the transistors 51A, 51B are connected to a power-source potential. Emitter terminals of the transistors 51A, 51B are connected to each other and are further connected to a current source 52 and a capacitor 53. When a potential at the input terminal IN is at a high level, the transistor 51A turns on and functions as a peak hold circuit. When a potential at the input terminal INB is at a high level, the transistor 51B turns on and functions as a peak hold circuit.

The current source 52 is an electric current source that supplies an emitter current when either of the transistors 51A, 51B turns on. A current value I1 of the current source 52 is set, for example, in the range of about 10 µA to 100 µA. The current source 52 also functions as an electric current source for discharging the capacitor 53 when the amplitude of the differential signal input between the input terminals IN, INB varies from a large state to a small state.

The capacitor 53 charges up with the emitter current of the transistors 51A, 51B, thereby to generate a hold potential corresponding to a peak value of the signal input between the input terminals IN, INB. The capacitance of the capacitor 53 is set, for example, in the range of 1 pF to 1 µF. The hold potential generated by the capacitor 53 is output as a peak value detection signal Vpm.

Two resistive elements 54A, 54B connected in series and having an identical resistance are connected between the input terminals IN, INB.

The amplitude detection circuit 45 further has a transistor 51C, a current source 55, and a capacitor 56. These transistor 51C, current source 55, and capacitor 56 constitute a circuit for detecting an average potential of the signal input to the input terminals IN, INB.

A base terminal of the transistor 51C is connected to a node between the two resistive elements 54A, 54B. A potential at the node between the resistive elements 54A, 54B is the average potential of the signal input to the input terminals IN, INB. An emitter terminal of the transistor 51C is connected to the current source 55 and the capacitor 56. When the emitter current is supplied from the current source 55 to the transistor 51C, the transistor 51C generates and outputs an average detection signal Vam corresponding to the average of the input signal to the emitter terminal. The capacitor 56 is an element for removal of noise during detection of the average and the capacitance of the capacitor 56 is set, for example, in the range of about 1 pF to 10 pF.

A difference circuit 57 is provided as a subsequent stage to the transistors 51A, 51B and the transistor 51C. One input of the difference circuit 57 is connected to the emitter terminals of the transistors 51A 51B. The other input of the difference circuit 57 is connected to the emitter terminal of the transistor 51C. The output of the difference circuit 57 is connected to the output terminal OUT of the amplitude detection circuit 45. The difference circuit 57 outputs to the output terminal OUT, a difference signal corresponding to a difference between the peak value detection signal Vpm output to the emitter terminals of the transistors 51A, 51B and the average detection signal Vam output to the emitter terminal of the transistor 51C. This difference signal corresponds to the amplitude of the signal input between the input terminals IN, INB.

A current value I3 of the current source 55 is set so that the base-emitter voltage voltage of the transistor 51C becomes equal to the base-emitter voltage in the on state of the transistors 51A, 51B. This setting cancels out the base-emitter voltage of the transistors 51A, 51B and the base-emitter voltage of the transistor 51C when the difference circuit 57 detects the difference between the peak value detection signal Vpm and the average detection signal Vam. Therefore, further improvement is achieved in detection accuracy of the amplitude of the signal input to the input terminals IN, INB. Specifically, the current value I3 is set so that a ratio of the emitter size of the transistors 51A, 51B to the current value I1 of the current source 52 becomes equal to a ratio of the emitter size of the transistor 51C to the current value I3 of the current source 55.

It is noted that the configuration of the amplitude detection circuit 45 does not have to be limited only to the above-described configuration but may be any circuit configuration as long as it can detect the amplitude of the component in the predetermined frequency band in the signal.

Figure 3:
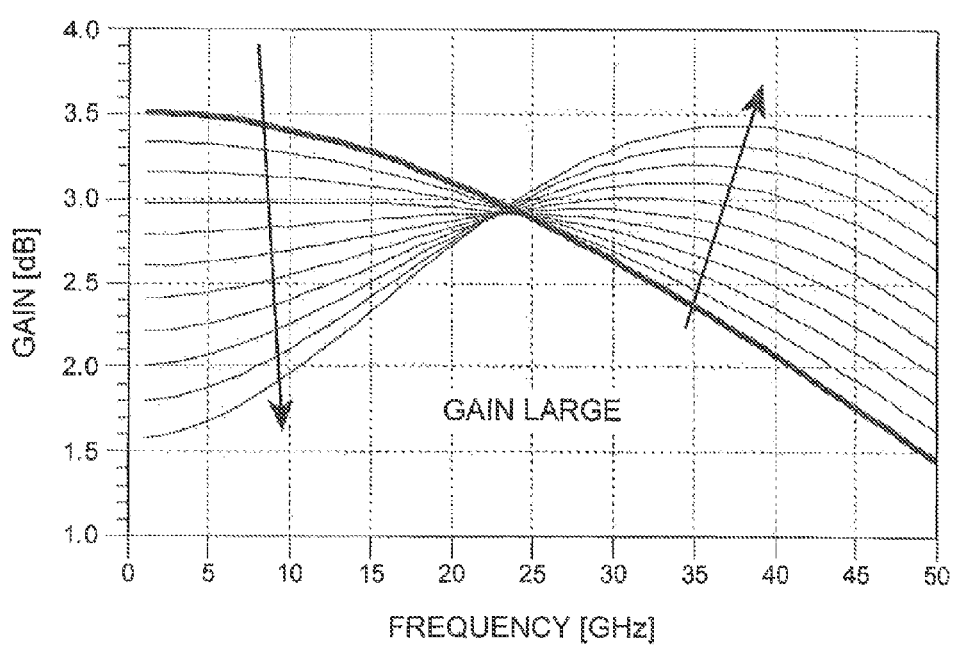
FIG. 3 is a graph showing frequency characteristics of a gain of a pre-emphasis circuit.
Figure 4:
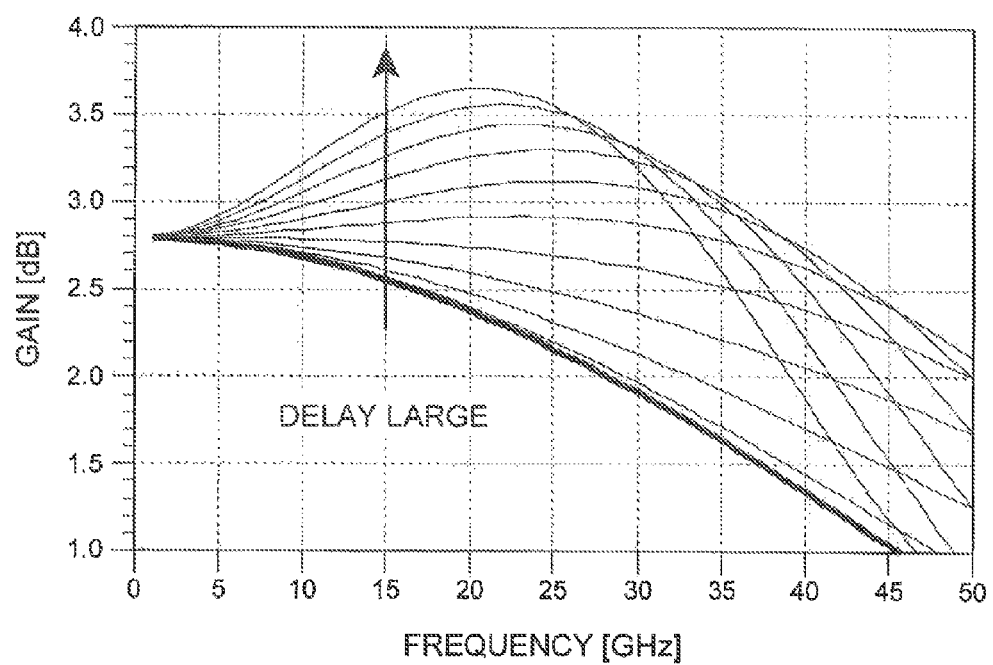
FIG. 4 is a graph showing frequency characteristics of a delay time of a variable delay circuit.

Frequency characteristics of the amplifier circuit 10 having the aforementioned configuration are shown in FIGS. 3 and 4. FIG. 3 shows changes in frequency characteristics of the gain of the amplifier circuit 10, with changes in the gain of the pre-emphasis circuit 24. A thick line in FIG. 3 indicates the frequency characteristics of the gain of the amplifier circuit 10, with the minimum gain of the pre-emphasis circuit 24. With increase in the gain of the pre-emphasis circuit 24, as indicated by arrows in FIG. 3, the gain of the amplifier circuit 10 decreases generally in the frequency band of not more than about 20 GHz while the gain of the amplifier circuit 10 increases generally in the frequency band of not less than about 25 GHz. At frequencies around 23 GHz, there is almost no change in the gain of the amplifier circuit 10, even with changes in the gain of the pre-emphasis circuit 24.

FIG. 4 shows changes in frequency characteristics of the gain of the amplifier circuit 10, with changes in the delay time of the variable delay circuit 23. A thick line in FIG. 4 indicates the frequency characteristics of the gain of the amplifier circuit 10, with the minimum delay time of the variable delay circuit 23. With increase in the delay time of the variable delay circuit 23, the gain of the amplifier circuit 10 increases in the entire frequency band. With further increase in the delay time of the variable delay circuit 23, the gain of the amplifier circuit 10 takes a maximum value at a certain frequency and then the gain of the amplifier circuit 10 decreases in a frequency band higher than the frequency. The frequency where the gain of the amplifier circuit 10 takes the maximum decreases with increase in the delay time of the variable delay circuit 23.

Figure 5:
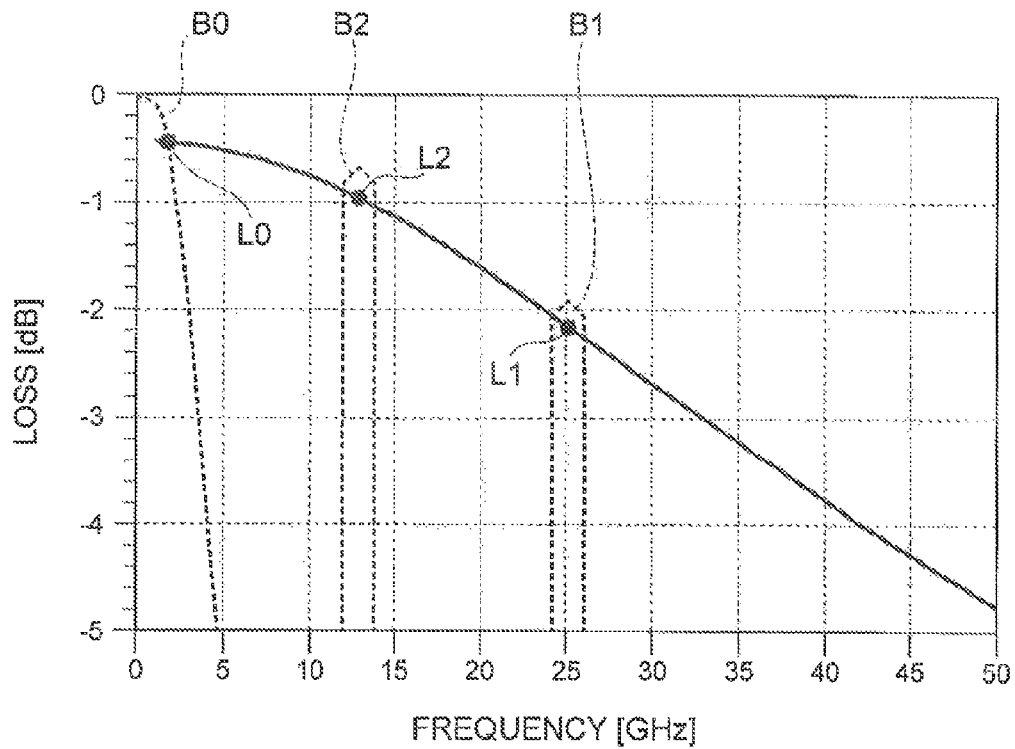
FIG. 5 is a graph schematically showing frequency bands in which the amplitude is detected by amplitude detection circuits.

The below will describe an operation for compensating the response of the main amplifier 22, in the amplifier circuit 10 of the present embodiment. FIG. 5 shows frequency dependence of input signal, and frequency hands where the loss is detected. A solid curve in FIG. 5 indicates a frequency characteristics of loss values of the input signal on the output side of the transmission line 30. The frequency bands indicated by dashed lines B1, B2, and B0 represent the first frequency band, the second frequency band, and the low frequency band as targets of detection of amplitude by the half bit rate amplitude detection circuit 45A, the quarter bit rate amplitude detection circuit 45B, and the low frequency amplitude detection circuit 45C, respectively. It is assumed herein that the frequency corresponding to the bit rate of the input signal is 50 GHz. Points L1, L2, and L0 indicate loss values detected by the half bit rate amplitude detection circuit 45A, the quarter bit rate amplitude detection circuit 45B, and the low frequency amplitude detection circuit 45C, respectively. In this case, L1 is approximately—2.2 dB, L2 approximately—1.0 dB, and L0 approximately—0.4 dB.

Figure 6:
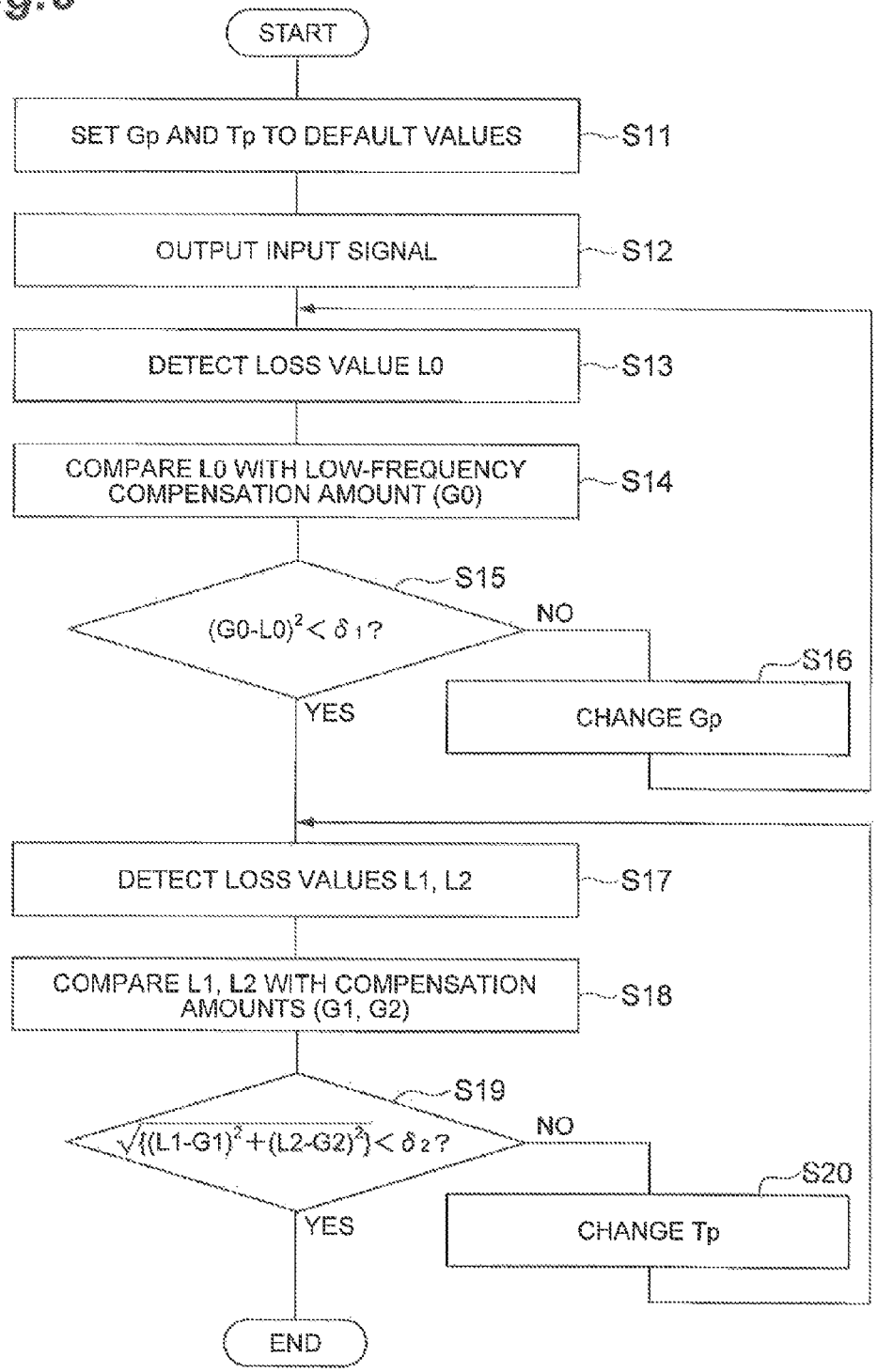
FIG. 6 is a flowchart showing an example of a method of determining compensation amount.

FIG. 6 is a flowchart showing the flow of the operation to compensate the response of the main amplifier 22. First, the controller 46 sets the gain Gp of the pre-emphasis circuit 24 and the delay time Tp of the variable delay circuit 23 to default values (step S11). Next, the amplifier circuit 10 is actuated to make the main amplifier 22 output the input signal (step S12). Next, the amplitude detection circuit 45 detects the loss value L0 in the subsequent stage to the transmission line 30 (step S13). Then the controller 46 compares the loss value L0 in the low frequency band with a compensation amount G0 by the variable delay circuit 23 and the pre-emphasis circuit 24 in the low frequency band (step S14). Specifically, the controller 46 performs the comparison according to the magnitude of $(G0-L0)^2$ being the square of the difference between the compensation amount G0 and the loss value L0. The controller 46 determines whether $(G0-L0)^2$ is smaller than a predetermined threshold $\delta_1$ (step S15). When $(G0-L0)^2$ is not smaller than the threshold $\delta_1$ (step S15: NO), the controller 46 changes the gain Gp of the pre-emphasis circuit 24 to decrease the difference between the compensation amount G0 and the loss value L0 (step S16). Thereafter, the operation shifts again to the processing at and after step S13.

Figure 7:
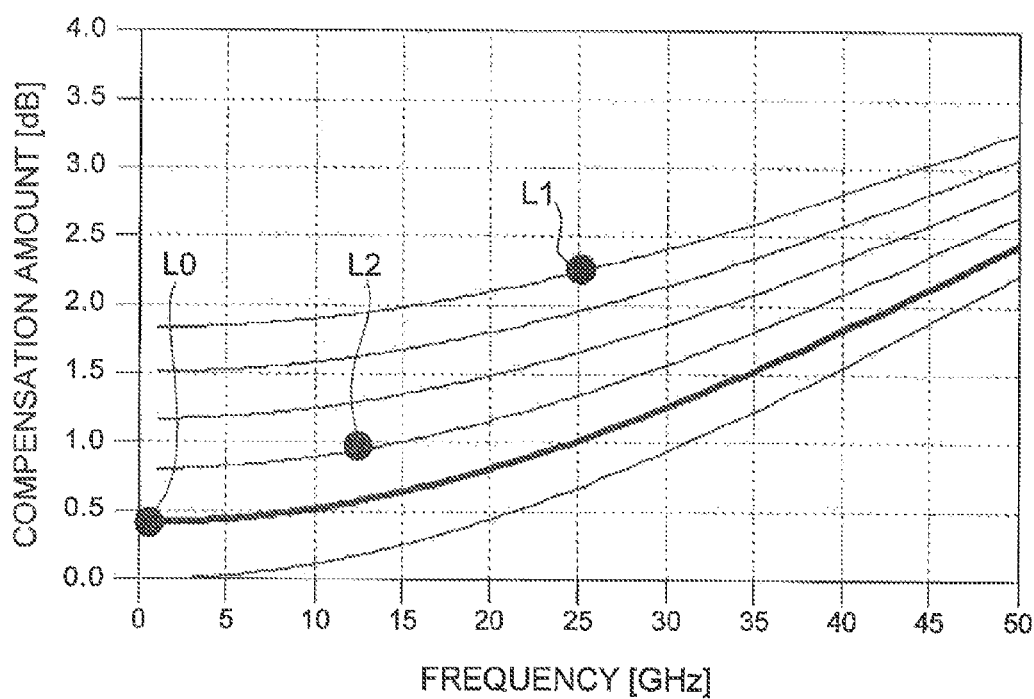
FIG. 7 is a graph for showing a method of determining a gain according to a compensation amount.

Relationship between the frequency characteristics of compensation amount and the gain Gp of the pre-emphasis circuit 24 will be explained with reference to FIG. 7. FIG. 7 shows the frequency characteristics of compensation amount by the variable delay circuit 23 and the pre-emphasis circuit 24, with changes in the gain Gp of the pre-emphasis circuit 24. With changes in the gain Gp of the pre-emphasis circuit 24, the frequency characteristics of compensation amount increases or decreases in the entire frequency band. In the processes of respective steps S13 to S16, the gain Gp of the pre-emphasis circuit 24 is adjusted so that the compensation amount G0 becomes closer to the loss value L0. As a result, the gain Gp of the pre-emphasis circuit 24 is determined so that the frequency characteristics of compensation amount becomes as indicated by a thick line in FIG. 7.

In step S15, when $(G0-L0)^2$ is smaller than the threshold $\delta_1$ (step S15:YES), the amplitude detection circuit 45 detects the loss values L1, L2 in the first and second frequency bands in the subsequent stage to the transmission line 30 (step S17). Next, the controller 46 compares the loss values L1, L2 with the compensation amounts G1, G2 by the variable delay circuit 23 and the pre-emphasis circuit 24 in the first and second frequency bands (step S18). Specifically, the square root of $\{(L1-G1)^2+(L2-G2)^2\}$ is calculated as a value indicative of a difference between the loss values L1, L2 and the compensation amounts G1, G2 and the comparison is made according to the magnitude of this value. The controller 46 determines whether the square root of $\{(L1-G1)^2+(L2-G2)^2\}$ is smaller than a predetermined threshold $\delta_2$ (step S19). When the square root of $\{(L1-G1)^2+(L2-G2)^2\}$ is not smaller than the threshold $\delta_2$ (step S19: NO), the controller 46 changes the delay time Tp of the variable delay circuit 23 to decrease the difference between the compensation amounts G1, G2 and the loss values L1, L2 (step S20). Thereafter, the operation shifts again to the processing at and after step S17.

Figure 8:
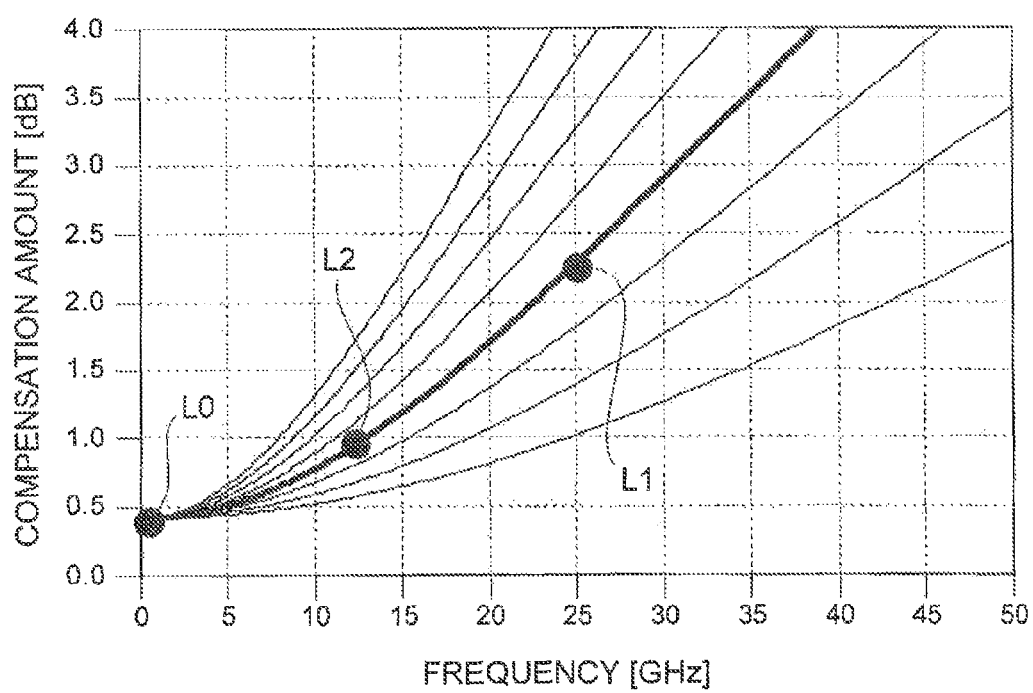
FIG. 8 is a graph for showing a method of determining a delay time according to a compensation amount.

Relationship between the frequency characteristics of compensation amount and the delay time Tp of the variable delay circuit 23 will be described with reference to FIG. 8. FIG. 8 shows changes in the frequency characteristics of compensation amount by the variable delay circuit 23 and the pre-emphasis circuit 24, with changes in the delay time Tp of the variable delay circuit 23. With changes in the delay time Tp of the variable delay circuit 23, the frequency characteristics of compensation amount largely increases or decreases on the high frequency band. In the aforementioned processes of respective steps S17 to S20, the delay time Tp of the variable delay circuit 23 is adjusted so that the compensation amounts G1, G2 become closer to the loss values L1, L2. As a result, the delay time Tp of the variable delay circuit 23 is determined so that the frequency characteristics of compensation amount becomes as indicated by a thick line in FIG. 8.

As previously described using FIG. 7, the compensation amount G0 in the low frequency band is adjusted in accordance with the loss value L0 in the processes of respective steps S13 to S160. As described using FIG. 8, the compensation amounts G1, G2 in the first frequency band and in the second frequency band are then adjusted in accordance with the loss values L1, L2. By this, the compensation amounts are adjusted in accordance with the loss amounts, respectively, in the first frequency band, in the second frequency band, and in the low frequency band.

Figure 9A:
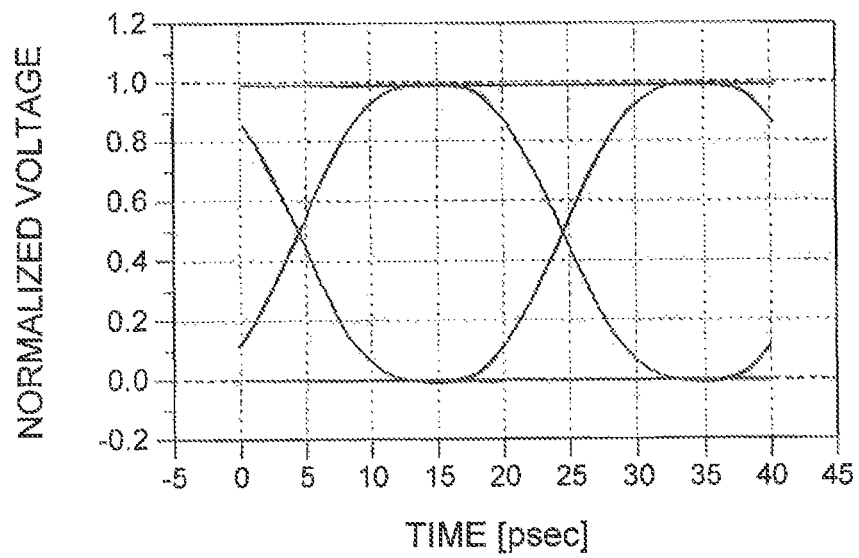
FIGS. 9A and 9B are graphs showing an eye pattern of an ideal input signal and an eye pattern of an output signal affected by transmission loss.
Figure 9B:
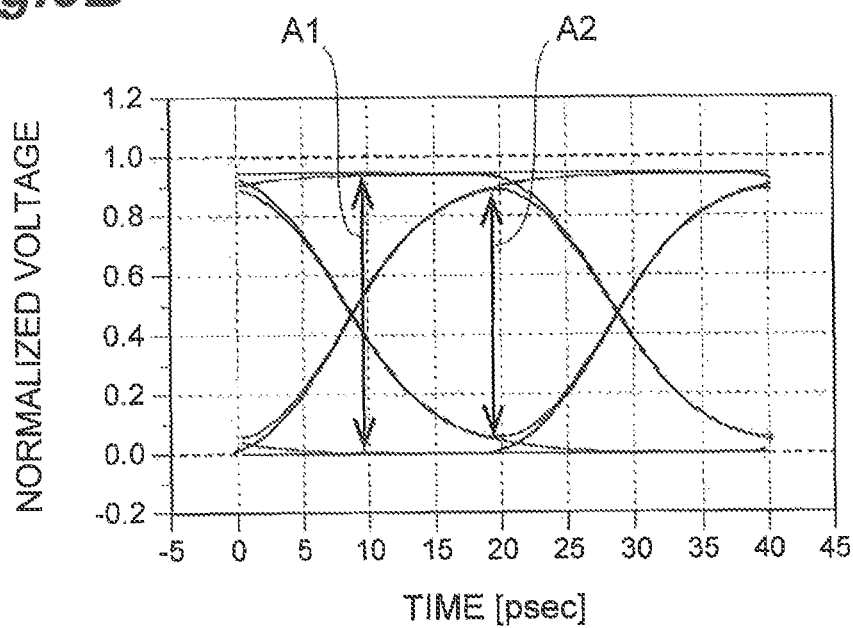

Temporal waveforms as the result of such adjustment of compensation amounts will be described using FIGS. 9 to 11. FIG. 9A is an eye pattern showing the temporal waveform of the input signal at the input terminals 11A, 11B of the amplifier circuit 10. FIG. 9B is an eye pattern showing the temporal waveform of the input signal on the output side of the transmission line 30, without adjustment of the delay time Tp of the variable delay circuit 23 and the gain Gp of the pre-emphasis circuit 24. FIG. 9B shows that the amplitude A2 in the case of the input signal varying quickly is lowered when compared with the amplitude A1 in the case of the input signal varying gently.

Figure 10:
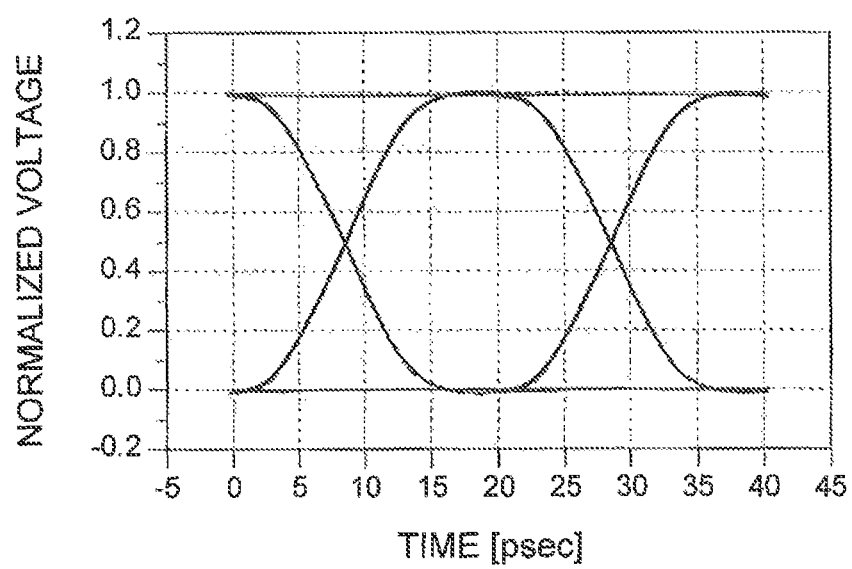
FIG. 10 is a graph showing an eye pattern of an output signal with an appropriate compensation.
Figure 11A:
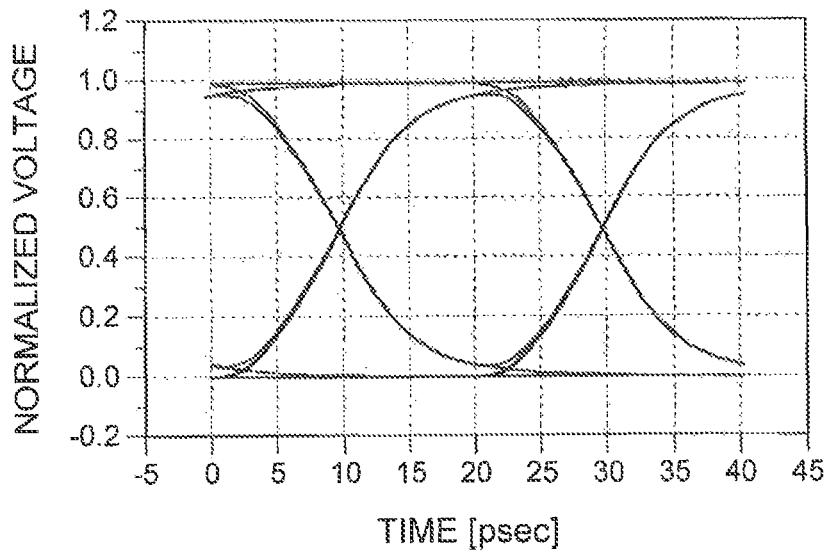
FIGS. 11A and 11B are graphs showing eye patterns of output signals with a too small delay time and with a too large delay time.
Figure 11B:
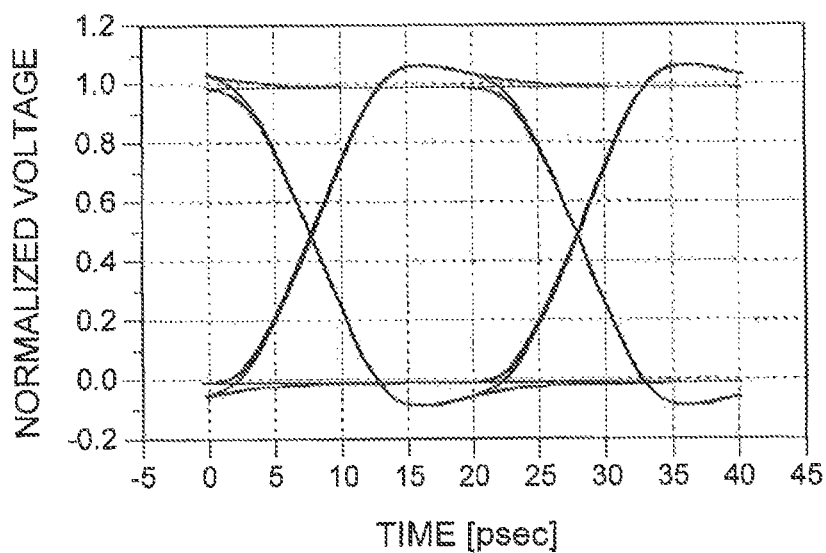

In contrast to it, FIG. 10 shows an eye pattern of the output signal with appropriate compensation for the variable delay circuit 23 and the pre-emphasis circuit 24 by the controller 46. Furthermore, FIG. 11A shows an eye pattern of the output signal in the case where the delay time of the variable delay circuit 23 is too small, and FIG. 11B shows en eye pattern of the output signal in the case where the delay time of the variable delay circuit 23 is too large. It is understood from FIG. 10 that an almost ideal eye pattern similar to FIG. 9A is obtained when appropriate compensation is made. On the other hand, it is seen from FIG. 11A that when the delay time of the variable delay circuit 23 is too small, reduction in amplitude of signal occurs as in the case of FIG. 9B. Furthermore, it is seen from FIG. 11B that when the delay time of the variable delay circuit 23 is too large, overshoots of signal occur.

In the amplifier circuit 10, as described above, the input signal amplified by the pre-emphasis circuit 24 after delayed by the variable delay circuit 23 is added to the input signal amplified by the main amplifier 22. This operation results in emphasizing rises and falls of the input signal of the approximately rectangular wave shape. Here, the controller 46 in the amplifier circuit 10 controls the gain of the pre-emphasis circuit 24 and the delay time of the variable delay circuit 23 so as to compensate the response of the main amplifier 22 in the first frequency band lower than the base frequency of the target signal and in the low frequency band higher than zero Hertz. Therefore, the response of the input signal is compensated in the first frequency band and in the low frequency band, whereby appropriate compensation is made suitably for rises and falls of the input signal, so as to suitably compensate the waveform of the input signal. Accordingly, the waveform of the output signal can be suitably compensated according to variation of the input signal.

In the present embodiment, particularly, the first frequency band includes the frequency equal to a half of the base frequency of the target signal and the response of the main amplifier 22 is further compensated in the second frequency band including the frequency equal to a quarter of the base frequency of the target signal as well. For this reason, the waveform of the input signal is further suitably compensated and the waveform of the output signal is also further suitably compensated.

The above showed and described the preferred embodiment of the present invention but it should be noted that the present invention is by no means limited to the foregoing specific embodiment. Namely, it is readily understood by those skilled in the art that various modifications and changes can be made within the scope of the gist of the present invention described in the scope of claims.

Figure 12:
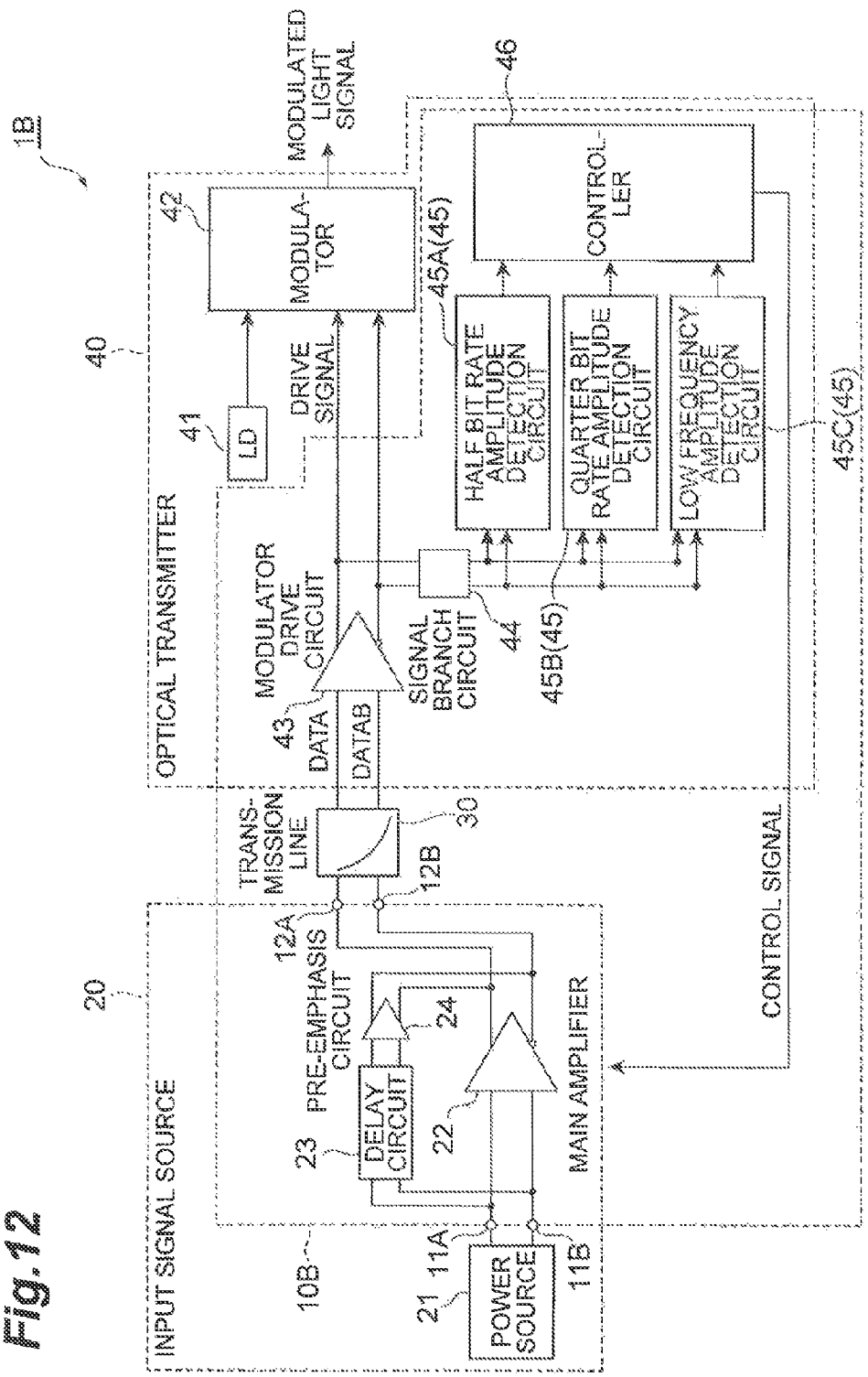
FIG. 12 is a block diagram showing a configuration of an amplifier circuit according to a modification example of the embodiment of the present invention.

For example, FIG. 12 shows a modification example of the above embodiment. An optical transmission device 1B according to the present modification example is provided with an amplifier circuit 10B. This amplifier circuit 10B, when compared with the foregoing amplifier circuit 10, is different therefrom in that the amplifier circuit 10B is further provided with the modulator driving circuit 43 as a final-stage amplifier which is connected as a subsequent stage to the transmission line 30 and which amplifies the signal transmitted through the transmission line 30. Furthermore, it is also different in that the signal branch circuit 44 is not connected as a preceding stage to the modulator driving circuit 43 but connected as a subsequent stage to the modulator driving circuit 43. In this configuration, the half bit rate amplitude detection circuit 45A, quarter bit rate amplitude detection circuit 45B, and low frequency amplitude detection circuit 45C detect the amplitude of the signal amplified by the modulator driving circuit 43. Therefore, the compensation for the waveform of the input signal is made by taking into account, not only the frequency characteristics of the transmission line 30 but also the frequency characteristics of the modulator driving circuit 43, whereby the waveform of the input signal is more suitably compensated.

In the foregoing amplifier circuit 10, the quarter bit rate amplitude detection circuit 45B may be omitted. The first frequency band where the amplitude of the input signal is detected in the half bit rate amplitude detection circuit 45A does not always have to be the band including the frequency equal to a half of the base frequency of the target signal as long as it is a frequency band lower than the base frequency of the target signal.

The amplifier circuit of the present invention is also preferably used in an optical transmission device having a configuration without the transmission line 30 wherein the input signal source 20 and the optical transmitter 40 are integrated with each other.

What is claimed is:

1. An amplifier circuit with an input terminal and an output terminal, the amplifier circuit comprising:
   a signal transmission element connected to the output terminal;
   a low frequency detection circuit connected to the signal transmission element, the low frequency detection circuit detecting an amplitude in a low frequency band of a signal transmitted through the signal transmission element, the low frequency band being higher than zero Hertz;
   a first frequency detection circuit connected to the signal transmission element, the first frequency detection circuit detecting an amplitude in a first frequency band of the signal transmitted through the signal transmission element, the first frequency band being lower than a base frequency of a target signal of compensation;
   a main amplifier connected between the input terminal and the output terminal, the main amplifier amplifying an input signal input to the input terminal and outputting an amplified signal to the output terminal;
   a compensation circuit connected in parallel to the main amplifier, the compensation circuit comprising a variable delay circuit and a variable gain inverting circuit, the variable delay circuit receiving the input signal and outputting a delay signal with a delay time from the input signal, the variable gain inverting circuit inverting and amplifying the delay signal with a gain and outputting a compensation signal to the output terminal; and
   a controller configured to control the gain of the variable gain inverting circuit and the delay time of the variable delay circuit so as to compensate a response of the main amplifier in the first frequency band and in the low frequency band,
   wherein the first frequency band includes a frequency equal to a half of the base frequency of the target signal, and
   wherein the controller controls the gain of the variable gain inverting circuit and the delay time of the variable delay circuit, based on the amplitudes detected by the low frequency detection circuit and by the first frequency detection circuit.

2. The amplifier circuit according to claim 1, wherein the controller controls the gain of the variable gain inverting circuit and the delay time of the variable delay circuit so as to further compensate the response of the main amplifier in a second frequency band including a frequency equal to a quarter of the base frequency of the target signal.

3. The amplifier circuit according to claim 2, wherein the controller changes the gain of the variable gain inverting circuit, thereby to compensate the response of the min amplifier in the low frequency band and changes the delay time of the variable delay circuit, thereby to compensate the response of the main amplifier in the first frequency band and in the second frequency band.

4. The amplifier circuit according to claim 1, further comprising:
   a final-stage amplifier connected to the signal transmission element, the final-stage amplifier amplifying the signal transmitted through the signal transmission element,
   wherein the low frequency detection circuit and the first frequency detection circuit detect the amplitudes of the signal amplified by the final-stage amplifier.

5. The amplifier circuit according to claim 1, further comprising a second frequency detection circuit connected to the signal transmission element, the second frequency detection circuit detecting an amplitude in a second frequency band of the signal transmitted through the signal transmission element, the second frequency hand including a frequency equal to a quarter of the base frequency of the target signal.

6. The amplifier circuit according to claim 5, further comprising:
   a final-stage amplifier connected to the signal transmission element, the final-stage amplifier amplifying the signal transmitted through the signal transmission element,
   wherein the low frequency detection circuit, the first frequency detection circuit, and the second frequency detection circuit detect the amplitudes of the signal amplified by the final-stage amplifier.

* * * * *